US006590944B1

(12) United States Patent
Kroeger

(10) Patent No.: US 6,590,944 B1
(45) Date of Patent: Jul. 8, 2003

(54) AUDIO BLEND METHOD AND APPARATUS FOR AM AND FM IN BAND ON CHANNEL DIGITAL AUDIO BROADCASTING

(75) Inventor: Brian William Kroeger, Sykesville, MD (US)

(73) Assignee: Ibiquity Digital Corporation, Columbia, MD (US)

( * ) Notice: Subject to any disclaimer, the term of this patent is extended or adjusted under 35 U.S.C. 154(b) by 0 days.

(21) Appl. No.: 09/261,468

(22) Filed: Feb. 24, 1999

(51) Int. Cl.[7] .................................................. H03D 1/00
(52) U.S. Cl. ........................................ 375/340; 375/346
(58) Field of Search ................................ 375/316, 340, 375/346, 322, 324; 370/486; 455/65, 132, 133

(56) References Cited

U.S. PATENT DOCUMENTS 4,382,299 A 5/1983 Dieterich
5,278,826 A 1/1994 Murphy et al. ............... 370/76
5,278,844 A 1/1994 Murphy et al. ............ 371/37.1
5,315,583 A 5/1994 Murphy et al. ............... 370/18
5,465,396 A 11/1995 Hunsinger et al. ............ 455/61
5,532,762 A 7/1996 Sakai et al. ................. 348/738
5,559,830 A 9/1996 Dapper et al. ............. 375/230

(List continued on next page.)

FOREIGN PATENT DOCUMENTS

EP 0 825 736 A2 2/1998
WO 9749207 12/1997
WO WO 99/20007 4/1999

OTHER PUBLICATIONS

Kroeger, B., Vigil, A., "Improved IBOC DAB Technology For AM and FM Broadcasting", Oct. 1996.
M. Alard, R. Lassale, "Principles of modulation and channel coding for digital broadcasting for mobile receivers", EBU Review, No. 224, pp. 168–190, Aug. 1987.
Kroeger, B.W., Peyla, P.J., "Robust IBOC DAB AM and FM Technology For Digital Audio Broadcasting", Apr. 1997.
Brian W. Kroeger and Paul J. Peyla, *Compatibility of FM Hybrid In–Band On–Channel (IBOC) System For Digital Audio Broadcasting*, IEEE Transactions on Broadcasting, (Dec. 1997), pp. 421–430, vol. 43, No. 4.

*Primary Examiner*—Stephen Chin
*Assistant Examiner*—David B. Lugo
(74) *Attorney, Agent, or Firm*—Robert P. Lenart, Esq.; Pietragallo, Bosick & Gordon

(57) ABSTRACT

A method is provided for processing a composite digital audio broadcast signal to mitigate intermittent interruptions in the reception of said digital audio broadcast signal. The method includes the steps of separating an analog modulated portion of the digital audio broadcast signal from a digitally modulated portion of the digital audio broadcast signal, producing a first plurality of audio frames having symbols representative of the analog modulated portion of the digital audio broadcast signal, and producing a second plurality of audio frames having symbols representative of the digitally modulated portion of the digital audio broadcast signal. The first plurality of audio frames is then combined with the second plurality of audio frames to produce a blended audio output. A method is also provided for transmitting a composite digital audio broadcast signal having an analog portion and a digital portion to mitigate intermittent interruptions in the reception of said digital audio broadcast signal. The method comprises the steps of arranging symbols representative of the digital portion of the digital audio broadcast signal into a plurality of audio frames, producing a plurality of modem frames, each of the modem frames including a predetermined number of the audio frames, and adding a frame synchronization signal to each of the modem frames. The modem frames are then transmitted along with the analog portion of the digital audio broadcast signal, with the analog portion being delayed by a time delay corresponding to an integral number of the modem frames. The invention also encompasses radio receivers and transmitters which process signals according to the above methods.

20 Claims, 4 Drawing Sheets

U.S. PATENT DOCUMENTS

| | | | | | |
|---|---|---|---|---|---|
| 5,584,051 | A | | 12/1996 | Goken et al. | 455/68 |
| 5,588,022 | A | | 12/1996 | Dapper et al. | 375/216 |
| 5,592,471 | A | | 1/1997 | Briskman | 455/52.3 |
| 5,606,576 | A | | 2/1997 | Dapper et al. | 375/268 |
| 5,633,896 | A | | 5/1997 | Carlin et al. | 375/340 |
| 5,673,292 | A | | 9/1997 | Carlin | 375/269 |
| 5,703,954 | A | | 12/1997 | Dapper et al. | 381/15 |
| 5,764,706 | A | | 6/1998 | Carlin et al. | 375/326 |
| 5,809,065 | A | | 9/1998 | Dapper et al. | 375/215 |
| 5,949,796 | A | | 9/1999 | Kumar | |
| 5,956,624 | A | * | 9/1999 | Hunsinger et al. | 455/65 |
| 6,148,008 | A | * | 11/2000 | Okamoto | 370/486 |
| 6,178,317 | B1 | * | 1/2001 | Kroeger et al. | 381/3 |

* cited by examiner

AUDIO BLEND METHOD AND APPARATUS FOR AM AND FM IN BAND ON CHANNEL DIGITAL AUDIO BROADCASTING

BACKGROUND OF THE INVENTION

This invention relates to methods and apparatus for signal processing, and more particularly to such methods and apparatus for mitigating the effects of signal fades, temporary blockages or severe channel impairments in an in-band-on-channel digital audio broadcasting system.

Digital Audio Broadcasting (DAB) is a medium for providing digital-quality audio, superior to existing analog broadcasting formats. Both AM and FM DAB signals can be transmitted in a hybrid format where the digitally modulated signal coexists with the currently broadcast analog AM or FM signal, or in an all-digital format without an analog signal. In-band-on-channel (IBOC) DAB systems require no new spectral allocations because each DAB signal is simultaneously transmitted within the spectral mask of an existing AM or FM channel allocation. IBOC promotes economy of spectrum while enabling broadcasters to supply digital quality audio to their present base of listeners. Several IBOC DAB approaches have been suggested.

FM IBOC DAB broadcasting systems have been the subject of several United States patents including U.S. Pat. Nos. 5,465,396; 5,315,583; 5,278,844 and 5,278,826. More recently, a proposed FM IBOC DAB signal combines an analog modulated carrier with a plurality of orthogonal frequency division multiplexed (OFDM) sub-carriers placed in the region from about 129 kHz to 199 kHz away from the FM center frequency, both above and below the spectrum occupied by an analog modulated host FM carrier.

One AM IBOC DAB approach, set forth in U.S. Pat. No. 5,588,022, presents a method for simultaneously broadcasting analog and digital signals in a standard AM broadcasting channel. Using this approach, an amplitude-modulated radio frequency signal having a first frequency spectrum is broadcast. The amplitude-modulated radio frequency signal includes a first carrier modulated by an analog program signal. Simultaneously, a plurality of digitally-modulated carrier signals are broadcast within a bandwidth which encompasses the first frequency spectrum. Each digitally-modulated carrier signal is modulated by a portion of a digital program signal. A first group of the digitally-modulated carrier signals lies within the first frequency spectrum and is modulated in quadrature with the first carrier signal. Second and third groups of the digitally-modulated carrier signals lie outside of the first frequency spectrum and are modulated both in-phase and in-quadrature with the first carrier signal. Multiple carriers are employed by means of orthogonal frequency division multiplexing (OFDM) to bear the communicated information.

Radio signals are subject to intermittent fades or blockages that must be addressed in broadcasting systems. Conventionally, FM radios mitigate the effects of fades or partial blockages by transitioning from full stereophonic audio to monophonic audio. Some degree of mitigation is achieved because the stereo information which is modulated on a sub-carrier, requires a higher signal-to-noise ratio to demodulate to a given quality level than does the monophonic information which is at the base band. However, there are some blockages which sufficiently "take out" the base band and thereby produce a gap in the reception of the audio signal. IBOC DAB systems should be designed to mitigate even those latter type outages in conventional analog broadcast, at least where such outages are of an intermittent variety and do not last for more than a few seconds. To accomplish that mitigation, digital audio broadcasting systems may employ the transmission of a primary broadcast signal along with a redundant signal, the redundant signal being delayed by a predetermined amount of time, on the order of several seconds, with respect to the primary broadcast signal. A corresponding delay is incorporated in the receiver for delaying the received primary broadcast signal. A receiver can detect degradation in the primary broadcast channel that represents a fade or blockage in the RF signal, before such is perceived by the listener. In response to such detection, the delayed redundant signal can be temporarily substituted for the corrupted primary audio signal, acting as a "gap filler" when the primary signal is corrupted or unavailable. This provides a blend function for smoothly transitioning from the primary audio signal to the delayed redundant signal.

The concept of blending from a DAB signal of an IBOC system to an analog, time delayed audio signal (AM or FM signal) is described in co-pending commonly assigned United States patent application for "A System And Method For Mitigating Intermittent Interruptions In An Audio Radio Broadcast System", Ser. No. 08/947,902, filed Oct. 9, 1997, now U.S. Pat. No. 6,178,317. The implementation implied in that application assumed that the analog signal can be delayed in real time through brute force hardware processing of the signal in real time where relative delays can be controlled precisely. However, it would be desirable to construct a delay control that can be implemented using non-real-time programmable digital signal processors (DSP). This invention provides a DAB signal processing method including diversity delay and blend functions that can be implemented using programmable DSP chips operating in non-real-time.

SUMMARY OF THE INVENTION

This invention provides a method for processing a composite digital audio broadcast signal to mitigate intermittent interruptions in the reception of the digital audio broadcast signal. The method includes the steps of separating an analog modulated portion of the digital audio broadcast signal from a digitally modulated portion of the digital audio broadcast signal, producing a first plurality of audio frames having symbols representative of the analog modulated portion of the digital audio broadcast signal, and producing a second plurality of audio frames having symbols representative of the digitally modulated portion of the digital audio broadcast signal. The first plurality of audio frames is then combined with the second plurality of audio frames to produce a blended audio output.

In addition, the invention encompasses a method for transmitting a composite digital audio broadcast signal having an analog portion and a digital portion to mitigate intermittent interruptions in the reception of the digital audio broadcast signal. The method comprises the steps of arranging symbols representative of the digital portion of the digital audio broadcast signal into a plurality of audio frames, producing a plurality of modem frames, each of the modem frames including a predetermined number of the audio frames, and adding a frame synchronization signal to each of the modem frames. The modem frames are then transmitted along with the analog portion of the digital audio broadcast signal, with the analog portion being delayed by a time delay corresponding to an integral number of the modem frames. The invention also encompasses radio receivers and transmitters which process signals according to the above methods.

DESCRIPTION OF THE PREFERRED EMBODIMENTS

Figure 1:
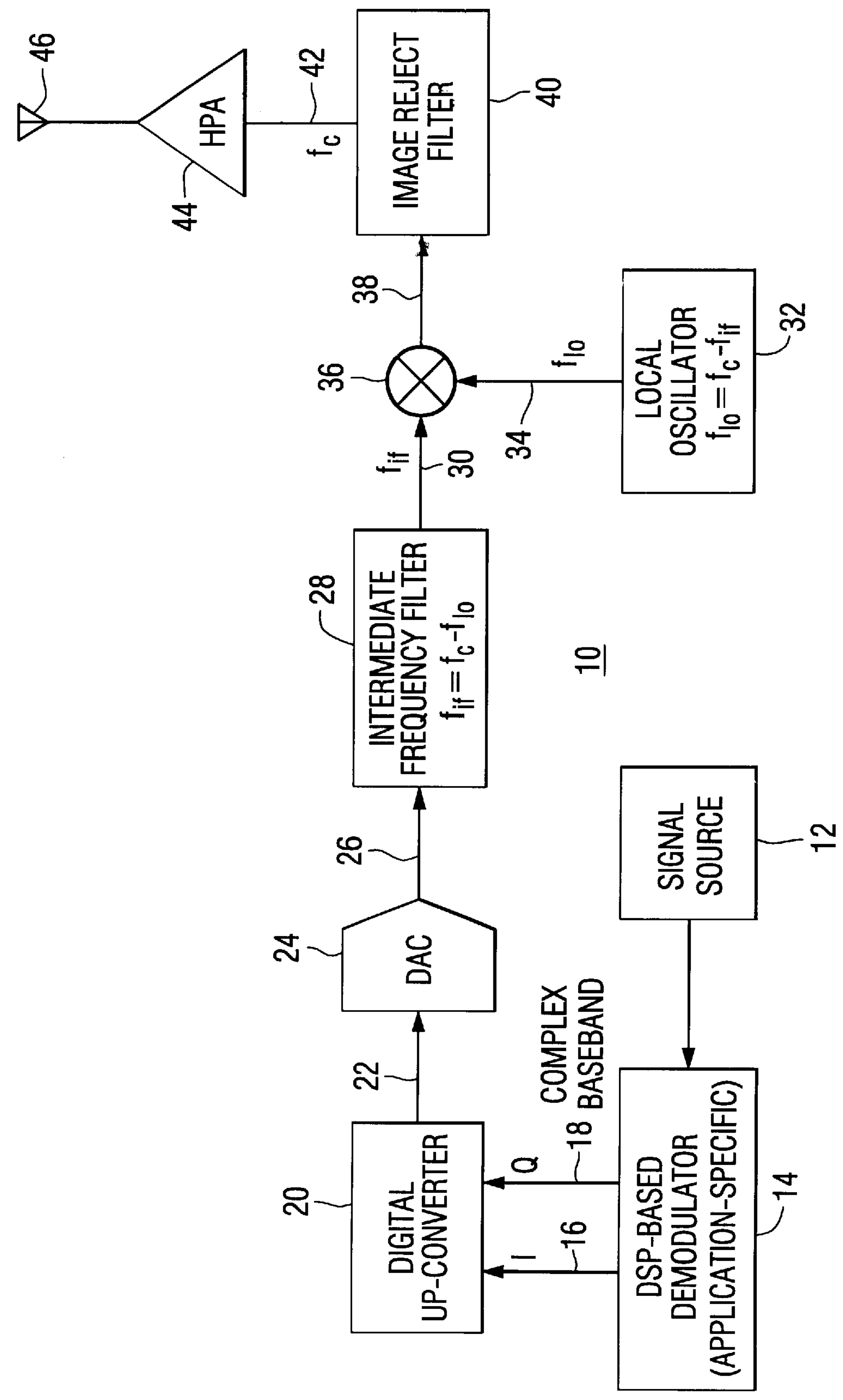
FIG. 1 is a block diagram of a DAB transmitter which can broadcast digital audio broadcasting signals in accordance with the present invention.

Referring to the Figures, FIG. 1, is a block diagram of a DAB transmitter 10 which can broadcast digital audio broadcasting signals in accordance with the present invention. A signal source 12 provides the signal to be transmitted. The source signal may take many forms, for example, an analog program signal and/or a digital information signal. A digital signal processor (DSP) based modulator 14 processes the source signal in accordance with various signal processing techniques which do not form a part of this invention, such as source coding, interleaving and forward error correction, to produce in-phase and quadrature components of the complex base band signal on lines 16 and 18. These components are shifted up in frequency, filtered and interpolated to a higher sampling rate in up-converter block 20. This produces digital samples at a rate $f_s$, on intermediate frequency signal $f_{if}$ on line 22. Digital-to-analog converter 24 converts the signal to an analog signal on line 26. An intermediate frequency filter 28 rejects alias frequencies to produce the intermediate frequency signal $f_{if}$ on line 30. A local oscillator 32 produces a signal $f_{lo}$, on line 34, which is mixed with the intermediate frequency signal on line 30 by mixer 36 to produce sum and difference signals on line 38. The sum signal and other unwanted intermodulation components and noise are rejected by image reject filter 40 to produce the modulated carrier signal $f_c$, on line 42. A high power amplifier 44 then sends this signal to an antenna 46.

Figure 2:
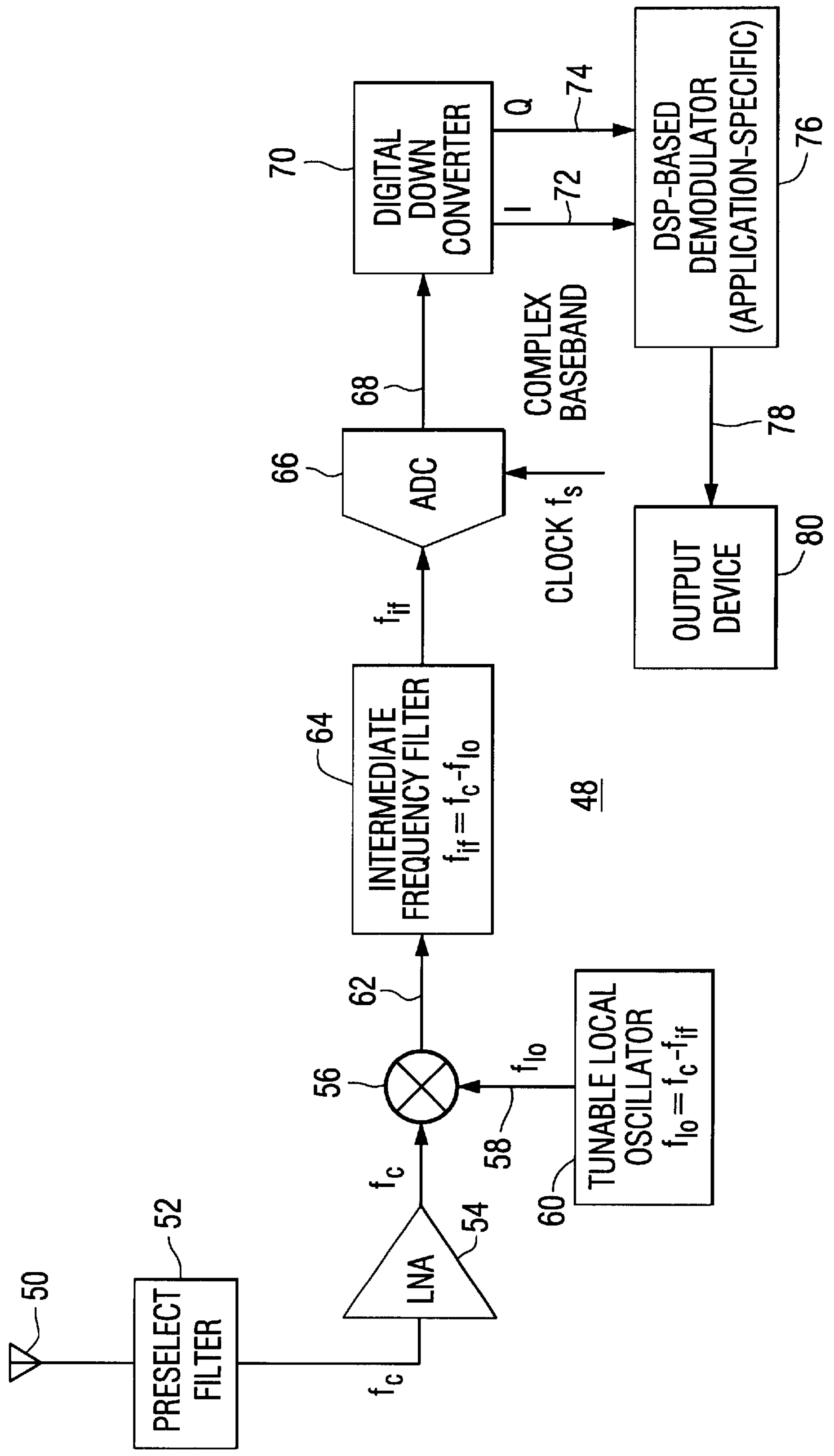
FIG. 2 is a block diagram of a radio receiver capable of blending analog and digital portions of a digital broadcasting signal in accordance with the present invention.

FIG. 2 is a block diagram of a radio receiver 48 constructed in accordance with this invention. The DAB signal is received on antenna 50. A bandpass preselect filter 52 passes the frequency band of interest, including the desired signal at frequency $f_c$, but rejects the image signal at $f_c - 2f_{if}$ (for a low side lobe injection local oscillator). Low noise amplifier 54 amplifies the signal. The amplified signal is mixed in mixer 56 with a local oscillator signal $f_{lo}$ supplied on line 58 by a tunable local oscillator 60. This creates sum $(f_c + f_{lo})$ and In the absence of the digital portion of the DAB audio signal (for example, when the channel is initially tuned, or when a DAB outage occurs), the analog AM or FM backup audio signal is fed to the audio output. When the DAB signal becomes available, the digital signal processor based demodulator implements a blend function to smoothly attenuate and eventually remove the analog backup signal while blending in the DAB audio signal such that the transition is minimally noticeable.

Similar blending occurs during channel outages which corrupt the DAB signal. The corruption is detected during the diversity delay time through cyclic redundancy checking (CRC) error detection means. In this case the analog signal is gradually blended into the output audio signal while attenuating the DAB signal such that the audio is fully blended to analog when the DAB corruption appears at the audio output. Furthermore, the receiver outputs the analog audio signal whenever the DAB signal is not present.

In one proposed digital audio broadcasting receiver design, the analog backup signal is detected and demodulated producing a 44.1 kHz audio sample stream (stereo in the case of FM which can further blend to mono or mute under low SNR conditions). The 44.1 kHz sample rate is synchronous with the receiver's local reference clock. The data decoder also generates audio samples at 44.1 kHz, however these samples are synchronous with the modem data stream which is based upon the transmitter's reference clock. Minute differences in the 44.1 kHz clocks between the transmitter and receiver prevent direct one-to-one blending of the analog signal samples since the audio content would eventually drift apart over time. Therefore some method of realigning the analog and DAB audio samples is required.

Figure 3:
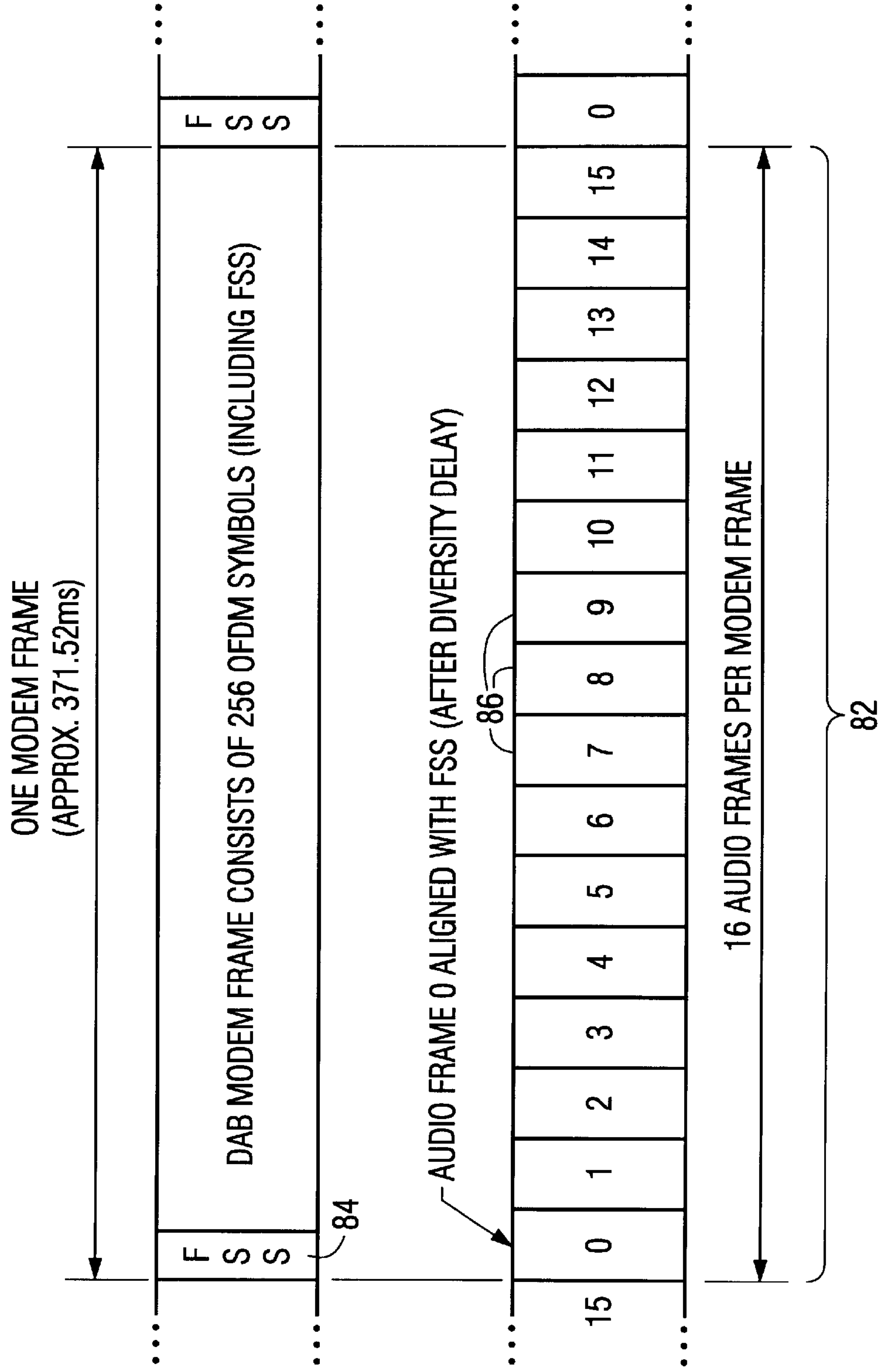
FIG. 3 is a timing diagram showing audio frame alignment with a frame synchronization symbol.

The transmitter modulator arranges digital information into successive modem frames 82 as illustrated in FIG. 3. A Frame Synchronization Symbol (FSS) 84 is transmitted at the start of each modem frame, occurring for example, every 256 OFDM symbols. The Frame Sync Symbol (FSS) indicates the alignment between the analog and digital signals as illustrated in FIG. 1. The modem frame duration in the preferred embodiment contains symbols from exactly 16 audio frames 86 (a period of about 371.52 milliseconds). The leading edge of the FSS is aligned with the leading edge of audio frame 0 (modulo 16). The equivalent leading edge of the analog backup signal is transmitted simultaneously with the leading edge of the FSS. The encoded data Frame which holds the equivalent compressed information for the Audio Frame 0 was actually transmitted prior to the Modem Frame that was transmitted in the past separated by exactly the diversity delay. The equivalent leading edge is defined as the time samples of the analog (FM) signal that corresponds to the first sample of the FSS, or start of the modem frame. The diversity delay is a defined integer multiple of Modem Frames. The diversity delay is significantly greater than the processing delays introduced by the digital processing in a DAB system, the delay being greater than 2.0 seconds, and preferably within a 3.0–5.0 second range.

Figure 4:
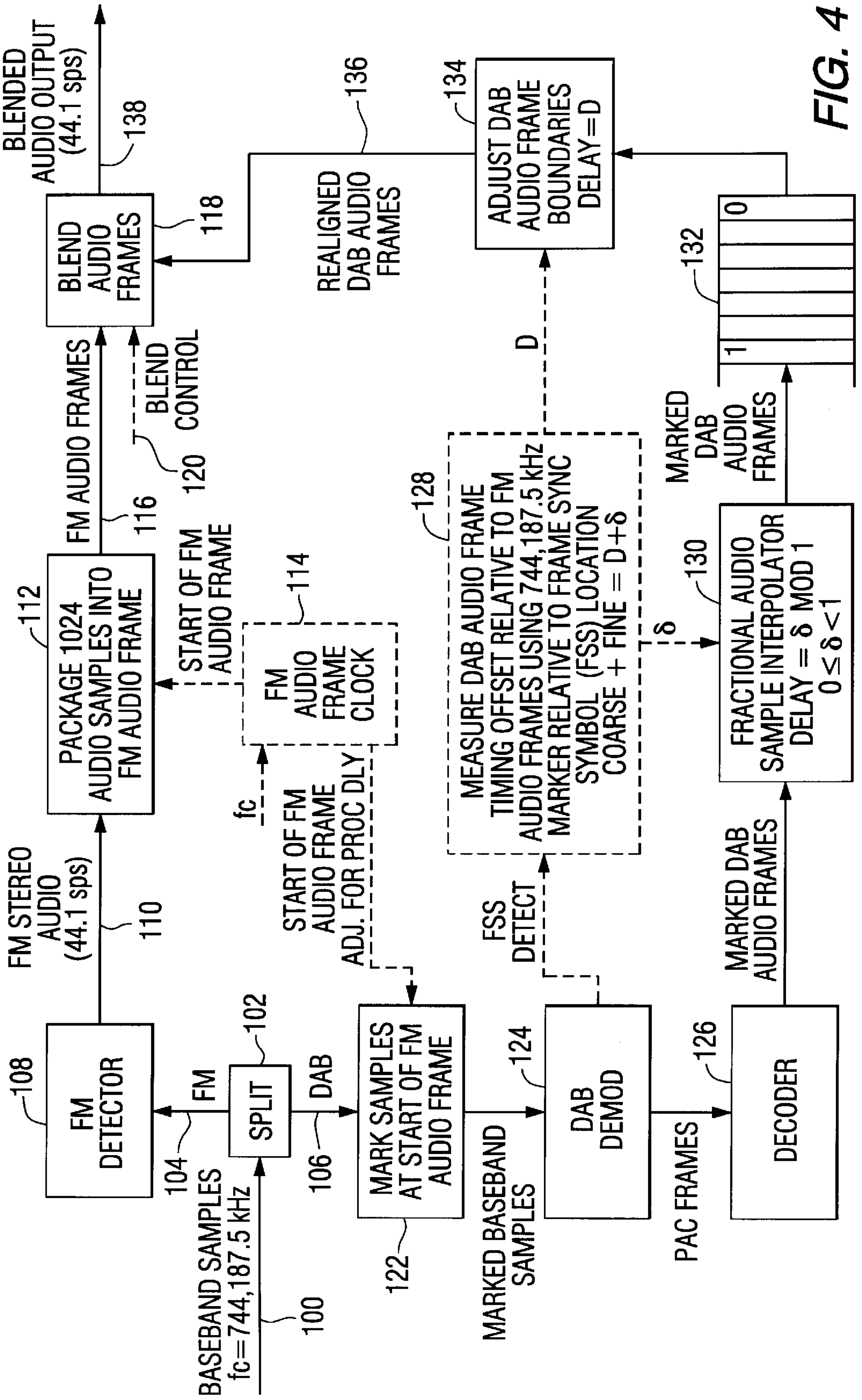
FIG. 4 is a functional block diagram illustrating the blend implementation for FM hybrid DAB receivers.

The analog and digital audio samples can be aligned through sample interpolation (resampling) of one of the audio streams such that it is synchronous with the other. If the local receiver 44.1 kHz clock is to be used for audio D/A output, then it is most convenient to resample the digital audio stream for blending into the analog audio stream, which is already synchronous to the receiver's local clock. This is accomplished as in the blend technique shown in the functional block diagram of FIG. 4. The blend implementation of FIG. 4 is intended to be compatible with non-real-time computer processing of the signal samples. For instance, any delays are implemented by counting signal samples instead of measuring absolute time or periodic clock counts. This involves "marking" signal samples where alignment is required. Therefore the implementation is amenable to loosely coupled DSP subroutines where bulk transfer and processing of signal samples is acceptable. The only restrictions then are absolute end-to-end processing delay requirements along with appropriate signal sample marking to eliminate ambiguity over the processing time window.

FM in the preferred embodiment). Block 102 illustrates that this signal is split into an analog FM signal path 104 and a digital signal path 106. This would be accomplished by using filters to separate the signals. The analog FM signal path is processed by the FM detector 108 producing a stereo audio output sequence sampled at 44.1 kHz on line 110. This FM stereo signal may also have its own blend-to-mono algorithm similar to what is already done in car radios to improve SNR at the expense of stereo separation. For convenience, as shown in block 112, the FM stereo sequence is framed into FM audio frames of 1024 audio stereo samples using the FM audio frame clock 114. These frames can then be transferred and processed in blocks. The FM audio frames on line 116 are then blended in block 118 with the realigned digital audio frames, when available. A blend control signal is input on line 120 to control the audio frame blending. The blend control signal controls the relative amounts of the analog and digital portions of the signal that are used to form the output. Typically the blend control signal is responsive to some measurement of degradation of the digital portion of the signal. The technique used to generate the blend control signal is not a part of this invention, however, the previously mentioned U.S. Pat. No. 6,178,317 describes a method for producing a blend control signal.

The baseband input signal is also split into the digital path 106 through its own filters to separate it from the analog FM signal. Block 122 shows that the DAB baseband signal is "marked" with the FM audio frame alignment after appropriate adjustment for different processing delay due to the splitter filters. This marking enables a subsequent alignment measurement such that the digital audio frames can be realigned to the FM audio frames. The digital signal demodulator 124 outputs the compressed and encoded data Frames to the decoder 126 for subsequent conversion into digital signal audio frames. The digital signal demodulator is also assumed to include modem signal detection, synchronization, and any FEC decoding needed to provided decoded and framed bits at its output. In addition, the digital signal demodulator detects the frame synchronization symbol (FSS) and measures the time delay relative to the marked baseband samples aligned to the FM audio frames. This measured time delay, as illustrated by block 128, reveals the digital signal audio frame offset time relative to the FM audio frame time with the resolution of the 744,187.5 kHz samples (i.e. resolution of ±672 nsec over an audio frame period). However, there remains an ambiguity regarding which audio frame is aligned (i.e. 0 through 15). This ambiguity is conveniently resolved by tagging each digital signal audio frame with a sequence number 0 through 15 modulo 16 over a modem frame period. For practical reasons it is recommended that the sequence number be identified using a much larger modulus (e.g. an 8-bit sequence number tags digital signal audio frames 0 through 255) to allow processing time "slop" while still preventing ambiguity in modem frame alignment over the diversity delay.

The audio frame ambiguity resolution discussed in the previous paragraph can also be simplified by encoding an exact number of audio frames per modem frame. This requires a modification in the audio encoder such that variable length audio frames are not permitted to straddle modem frame boundaries. This simplification can eliminate the need for the sequence tagging of audio frames since these frames (e.g. 16, 32, or 64 audio frames) would appear in a known fixed sequence within each modem frame.

After the alignment error is measured and known, this error is removed by realigning the digital signal audio Frames by exactly this amount. This is accomplished in 2 steps. The first realignment step removes the fractional sample misalignment error δ using the fractional audio sample interpolator 130. In effect the fractional audio sample Interpolator simply resamples the digital signal audio samples with a delay δ. The next step in the realignment removes the integer portion of the sample delay error. This is accomplished by passing the fractionally realigned audio samples into a first in first out (FIFO) buffer 132. After these samples are read out of the FIFO buffer, they are readjusted as illustrated by block 134 such that the realigned digital signal audio frames are synchronous with the FM Audio Frames. The FIFO buffer introduces a significant delay which includes the diversity delay minus the delay incurred by the encoder. The realigned digital signal audio frames on line 136 are then blended with the FM audio frames on line 116 to produce a blended audio output on line 138.

Although the frame ambiguity can be resolved only at Modem Frame boundaries, the fractional audio sample portion (δ) of the timing offset of the FSS relative to the marked digital signal baseband sample should be measured at the start of each FM audio frame. This allows smoothing of the fractional interpolation delay value δ in order to minimize resample timing jitter. The dynamic change in the error value δ over time is proportional to the local clock error. For example, if the local clock error is 10 ppm relative to the DAB transmitter clock, then the fractional sample error δ will change by a whole audio sample approximately every 2.3 seconds. Similarly the change in δ over one modem frame time is about one sixth of an audio sample. This step size may be too large for high quality audio. Therefore the smoothing of δ is desirable to minimize this timing jitter.

This particular blend implementation allows the DAB demodulator, the decoder, and fractional sample Interpolator to operate without stringent timing constraints, as long as these processes are completed within the diversity delay time such that the digital signal audio frames are available at the appropriate blend times.

The audio blend function of this invention incorporates the diversity delay required of all the DAB IBOC systems. The preferred embodiment includes audio sample rate alignment with a 44.1 kHz clock derived from the receiver's local clock source. The particular implementation described here involves the use of programmable DSPs operating in non-real-time as opposed to real-time hardware implementation. The alignment must accommodate a virtual 44.1 kHz DAB clock which is synchronous with the transmitted DAB digital signal. Although the transmitter and local receiver clocks are nominally designed for 44.1 kHz audio sample rate, physical clock tolerances result in an error which must be accommodated at the receiver. The method of alignment involves the interpolation (resampling) of the DAB audio signal to accommodate this clock error.

While the present invention has been described in terms of its preferred embodiment, it will be apparent to those skilled in the art that various modifications can be made to the described embodiment without departing from the scope of the invention as defined by the following claims.

We claim:

1. A method for processing a composite digital audio broadcast signal to mitigate intermittent interruptions in the reception of said digital audio broadcast signal, said method comprising the steps of:

separating an analog modulated portion of said digital audio broadcast signal from a digitally modulated portion of said digital audio broadcast signal;

producing a first plurality of audio frames having symbols representative of said analog modulated portion of said digital audio broadcast signal;

producing a second plurality of audio frames having symbols representative of said digitally modulated portion of said digital audio broadcast signal; and digitally combining the first plurality of audio frames with the second plurality of audio frames to produce a blended audio output.

2. The method of claim 1, further comprising the steps of:

marking said second plurality of audio frames with a symbol representative of the alignment of said second plurality of audio frames.

3. The method of claim 1, further comprising e steps of:

measuring an offset between said first and second plurality of audio frames to produce an error signal;

adjusting said second plurality of audio frames in response to said error signal; and delaying the adjusted second plurality of audio frames prior to said step of combining the first plurality of audio frames with the second plurality of audio frames to produce a blended audio output.

4. The method of claim 1, wherein the step of producing a first plurality of audio frames representative of said analog modulated portion of said digital audio broadcast signal comprises the steps of:

sampling said analog modulated portion of said digital audio broadcast signal to produce symbols for said first plurality of audio frames; and arranging a predetermined number of said first plurality of said audio frames into each of a first plurality of modem frames.

5. The method of claim 4, wherein the step of producing a second plurality of audio frames representative of said digitally modulated portion of said digital audio broadcast signal comprises the steps of:

arranging said predetermined number of said second plurality of said audio frames into each of a second plurality of modem frames.

6. A radio receiver for processing a composite digital audio broadcast signal to mitigate intermittent interruptions in the reception of the digital audio broadcast signal, the receiver comprising:

means for separating an analog modulated portion of said digital audio broadcast signal from a digitally modulated portion of said digital audio broadcast signal;

means for producing a first plurality of audio frames having symbols representative of said analog modulated portion of said digital audio broadcast signal;

means for producing a second plurality of audio frames having symbols representative of said digitally modulated portion of said digital audio broadcast signal; and means for digitally combining the first plurality of audio frames with the second plurality of audio frames to produce a blended audio output.

7. The receiver of claim 6, further comprising:

means for marking said second plurality of audio frames with a symbol representative of the alignment of said second plurality of audio frames.

8. The receiver of claim 6, further comprising:

means for measuring an offset between said first and second plurality of audio frames to produce an error signal;

means for adjusting said second plurality of audio frames in response to said error signal; and means for delaying the adjusted second plurality of audio frames prior to combining the first plurality of audio frames with the second plurality of audio frames to produce a blended audio output.

9. The receiver of claim 6, wherein the means for producing a first plurality of audio frames representative of said analog modulated portion of said digital audio broadcast signal comprises:

means for sampling said analog modulated portion of said digital audio broadcast signal to produce symbols for said first plurality of audio frames; and means for arranging a predetermined number of said first plurality of said audio frames into each of a first plurality of modem frames.

10. The receiver of claim 9, wherein the means for producing a second plurality of audio frames representative of said digitally modulated portion of said digital audio broadcast signal comprises:

means for arranging said predetermined number of said second plurality of said audio frames into each of a second plurality of modem frames.

11. The method of claim 1, further comprising the step of:

using the first plurality of audio frames to produce an initial audio output prior to the combining step.

12. The method of claim 1, further comprising the step of:

detecting corruption of the digitally modulated portion of said digital audio broadcast signal prior to the combining step.

13. The method of claim 12, wherein the step of detecting corruption of the digitally modulated portion of said digital audio broadcast signal comprises the step of:

cyclic redundancy checking the digitally modulated portion of said digital audio broadcast signal.

14. The receiver of claim 6, further comprising:

means for detecting corruption of the digitally modulated portion of said digital audio broadcast signal prior to the combining step.

15. The receiver of claim 14, wherein the means for detecting corruption of the digitally modulated portion of said digital audio broadcast signal comprises:

means for cyclic redundancy checking the digitally modulated portion of said digital audio broadcast signal.

16. A radio receiver for processing a composite digital audio broadcast signal to mitigate intermittent interruptions in the reception of said digital audio broadcast signal, the radio receiver comprising:

a signal splitter for separating an analog modulated portion of said digital audio broadcast signal from a digitally modulated portion of said digital audio broadcast signal;

a processor for producing a first plurality of audio frames having symbols representative of said analog modulated portion of said digital audio broadcast signal;

a demodulator for producing a second plurality of audio frames having symbols representative of said digitally modulated portion of said digital audio broadcast signal; and a blend control for digitally combining the first plurality of audio frames with the second plurality of audio frames to produce a blended audio output.

17. The receiver of claimed 16, further comprising:

a decoder for marking said second plurality of audio frames with a symbol representative of the alignment of said second plurality of audio frames.

18. The receiver of claim 16, further comprising:

means for measuring an offset between said first and second plurality of audio frames to produce an error signal;

means for adjusting said second plurality of audio frames in response to said error signal; and means for delaying the adjusted second plurality of audio frames prior to said step of combining the first plurality of audio frames with the adjusted second plurality of audio frames to produce a blended audio output.

19. The receiver of claim 16, wherein the processor for producing a first plurality of audio frames representative of said analog modulated portion of said digital audio broadcast signal comprises:

means for sampling said analog modulated portion of said digital audio broadcast signal to produce symbols for said first plurality of audio frames; and means for arranging a predetermined number of said first plurality of said audio frames into each of a first plurality of modem frames.

20. The receiver of claim 19, wherein the demodulator for producing a second plurality of audio frames representative of said digitally modulated portion of said digital audio broadcast signal comprises:

means for arranging said predetermined number of said second plurality of said audio frames into each of a second plurality of modem frames.

* * * * *

UNITED STATES PATENT AND TRADEMARK OFFICE

CERTIFICATE OF CORRECTION

PATENT NO. : 6,590,944 B1
DATED : July 8, 2003

INVENTOR(S) : Brian William Kroeger

It is certified that error appears in the above-identified patent and that said Letters Patent is hereby corrected as shown below:

<u>Column 3,</u>
Line 52, "($f_c$+$f_{lo}$) and" should read -- ($f_c$+$f_{lo}$) and difference ($f_c$-$f_{lo}$) signals on line 62. Intermediate frequency filter 64 passes the intermediate frequency signal $f_{if}$ and attenuates frequencies outside of the bandwidth of the modulated signal of interest. An analog-to-digital converter 66 operates using a clock signal $f_s$ to produce digital samples on line 68 at a rate of $f_s$. Digital down converter 70 frequency shifts, filters and decimates the signal to produce lower sample rate inphase and quadrature signals on lines 72 and 74. A digital signal processor based demodulator 76 then provides additional signal processing to produce an output signal on line 78 for output device 80. --.

<u>Column 4,</u>
Lines 62, "FM in the preferred embodiment)…." should read -- FIG. 4 is a functional block diagram of the relevant portion of an FM Hybrid DAB receiver. An AM Hybrid DAB receiver would include nearly identical functionality. To facilitate the description of the invention in FIG. 4, program signal paths are shown as solid lines, while control signal paths are shown in broken lines. The signal input to the blend function on line 100 is the complex baseband modem signal (samples at 744,187.5 kHz for FM in the preferred embodiment)…. --.

<u>Column 7,</u>
Line 8, "e" should read -- the --.

<u>Column 8,</u>
Line 58, "claimed" should read -- claim --.

Signed and Sealed this

Ninth Day of May, 2006

JON W. DUDAS
*Director of the United States Patent and Trademark Office*

UNITED STATES PATENT AND TRADEMARK OFFICE

CERTIFICATE OF CORRECTION

PATENT NO. : 6,590,944 B1
APPLICATION NO. : 09/261468
DATED : July 8, 2003
INVENTOR(S) : Brian William Kroeger It is certified that error appears in the above-identified patent and that said Letters Patent is hereby corrected as shown below:

Title page
Item (56) References Cited, other Publications, insert -- Hartup, D.C., Alley, D.M., Goldtston, D.R., "AM Hybird IBDC DAB System", Sept. 1997 --.

Column 3,
Line 52, "($f_c$+$f_{lo}$) and" should read -- ($f_c$+$f_{lo}$) and difference ($f_c$-$f_{lo}$) signals on line 62. Intermediate frequency filter 64 passes the intermediate frequency signal $f_{if}$ and attenuates frequencies outside of the bandwidth of the modulated signal of interest. An analog-to-digital converter 66 operates using a clock signal $f_s$ to produce digital samples on line 68 at a rate of $f_s$. Digital down converter 70 frequency shifts, filters and decimates the signal to produce lower sample rate inphase and quadrature signals on lines 72 and 74. A digital signal processor based demodulator 76 then provides additional signal processing to produce an output signal on line 78 for output device 80. --.

Column 4,
Lines 62, "FM in the preferred embodiment)…." should read -- FIG. 4 is a functional block diagram of the relevant portion of an FM Hybrid DAB receiver. An AM Hybrid DAB receiver would include nearly identical functionality. To facilitate the description of the invention in FIG. 4, program signal paths are shown as solid lines, while control signal paths are shown in broken lines. The signal input to the blend function on line 100 is the complex baseband modem signal (samples at 744,187.5 kHz for FM in the preferred embodiment)…. --.

Column 7,
Line 8, "e" should read -- the --.

UNITED STATES PATENT AND TRADEMARK OFFICE

CERTIFICATE OF CORRECTION

PATENT NO. : 6,590,944 B1 
APPLICATION NO. : 09/261468
DATED : July 8, 2003
INVENTOR(S) : Brian William Kroeger It is certified that error appears in the above-identified patent and that said Letters Patent is hereby corrected as shown below:

<u>Column 8,</u>
Line 58, “claimed” should read -- claim --.

This certificate supersedes Certificate of Correction issued May 9, 2006.

Signed and Sealed this

Twelfth Day of September, 2006

JON W. DUDAS
*Director of the United States Patent and Trademark Office*

UNITED STATES PATENT AND TRADEMARK OFFICE

CERTIFICATE OF CORRECTION

PATENT NO. : 6,590,944 B1

APPLICATION NO. : 09/261468

DATED : July 8, 2003

INVENTOR(S) : Brian William Kroeger

It is certified that error appears in the above-identified patent and that said Letters Patent is hereby corrected as shown below:

Title page

Item (56) References Cited, other Publications, insert -- Hartup, D.C., Alley, D.M., Goldtston, D.R., “AM Hybrid IBOC IBDC DAB System”, Sept. 1997 --.

Column 3,

Line 52, “($f_c$+$f_{lo}$) and” should read -- ($f_c$+$f_{lo}$) and difference ($f_c$-$f_{lo}$) signals on line 62. Intermediate frequency filter 64 passes the intermediate frequency signal $f_{if}$ and attenuates frequencies outside of the bandwidth of the modulated signal of interest. An analog-to-digital converter 66 operates using a clock signal $f_s$ to produce digital samples on line 68 at a rate of $f_s$. Digital down converter 70 frequency shifts, filters and decimates the signal to produce lower sample rate inphase and quadrature signals on lines 72 and 74. A digital signal processor based demodulator 76 then provides additional signal processing to produce an output signal on line 78 for output device 80. --.

Column 4,

Lines 62, “FM in the preferred embodiment)....” should read -- FIG. 4 is a functional block diagram of the relevant portion of an FM Hybrid DAB receiver. An AM Hybrid DAB receiver would include nearly identical functionality. To facilitate the description of the invention in FIG. 4, program signal paths are shown as solid lines, while control signal paths are shown in broken lines. The signal input to the blend function on line 100 is the complex baseband modem signal (samples at 744,187.5 kHz for FM in the preferred embodiment).... --.

Column 7,

Line 8, “e” should read -- the --.

UNITED STATES PATENT AND TRADEMARK OFFICE

CERTIFICATE OF CORRECTION

PATENT NO. : 6,590,944 B1
APPLICATION NO. : 09/261468
DATED : July 8, 2003
INVENTOR(S) : Brian William Kroeger It is certified that error appears in the above-identified patent and that said Letters Patent is hereby corrected as shown below:

Column 8,
Line 58, “claimed” should read -- claim --.

This certificate supersedes Certificate of Correction issued May 9, 2006 and September 12, 2006.

Signed and Sealed this

Twenty-eighth Day of November, 2006

JON W. DUDAS
*Director of the United States Patent and Trademark Office*

UNITED STATES PATENT AND TRADEMARK OFFICE

CERTIFICATE OF CORRECTION

PATENT NO. : 6,590,944 B1

APPLICATION NO. : 09/261468
DATED : July 8, 2003
INVENTOR(S) : Brian William Kroeger It is certified that error appears in the above-identified patent and that said Letters Patent is hereby corrected as shown below:

Title page
Item (56) References Cited, other Publications, insert -- Hartup, D.C., Alley, D.M., Goldtston, D.R., "AM Hybrid IBOC DAB System", Sept. 1997 --.

Column 3,
Line 52, "($f_c$+$f_{lo}$) and" should read -- ($f_c$+$f_{lo}$) and difference ($f_c$-$f_{lo}$) signals on line 62. Intermediate frequency filter 64 passes the intermediate frequency signal $f_{if}$ and attenuates frequencies outside of the bandwidth of the modulated signal of interest. An analog-to-digital converter 66 operates using a clock signal $f_s$ to produce digital samples on line 68 at a rate of $f_s$. Digital down converter 70 frequency shifts, filters and decimates the signal to produce lower sample rate inphase and quadrature signals on lines 72 and 74. A digital signal processor based demodulator 76 then provides additional signal processing to produce an output signal on line 78 for output device 80. --.

Column 4,
Lines 62, "FM in the preferred embodiment)…." should read -- FIG. 4 is a functional block diagram of the relevant portion of an FM Hybrid DAB receiver. An AM Hybrid DAB receiver would include nearly identical functionality. To facilitate the description of the invention in FIG. 4, program signal paths are shown as solid lines, while control signal paths are shown in broken lines. The signal input to the blend function on line 100 is the complex baseband modem signal (samples at 744,187.5 kHz for FM in the preferred embodiment)…. --.

Column 7,
Line 8, "e" should read -- the --.

UNITED STATES PATENT AND TRADEMARK OFFICE

CERTIFICATE OF CORRECTION

PATENT NO. : 6,590,944 B1 
APPLICATION NO. : 09/261468
DATED : July 8, 2003
INVENTOR(S) : Brian William Kroeger It is certified that error appears in the above-identified patent and that said Letters Patent is hereby corrected as shown below:

Column 8,
Line 58, “claimed” should read -- claim --.

This certificate supersedes Certificate of Correction issued May 9, 2006, September 12, 2006, and November 28, 2006.

Signed and Sealed this

Sixteenth Day of January, 2007

JON W. DUDAS
*Director of the United States Patent and Trademark Office*

UNITED STATES PATENT AND TRADEMARK OFFICE

CERTIFICATE OF CORRECTION

PATENT NO. : 6,590,944 B1
APPLICATION NO. : 09/261468
DATED : July 8, 2003
INVENTOR(S) : Brian William Kroeger It is certified that error appears in the above-identified patent and that said Letters Patent is hereby corrected as shown below:

Title page
Item (56) References Cited, other Publications, insert -- Hartup, D.C., Alley, D.M., Goidston, D.R., "AM Hybrid IBOC DAB System", Sept. 1997 --.

Column 3,
Line 52, "($f_c$+$f_{lo}$) and" should read -- ($f_c$+$f_{lo}$) and difference ($f_c$-$f_{lo}$) signals on line 62. Intermediate frequency filter 64 passes the intermediate frequency signal $f_{if}$ and attenuates frequencies outside of the bandwidth of the modulated signal of interest. An analog-to-digital converter 66 operates using a clock signal $f_s$ to produce digital samples on line 68 at a rate of $f_s$. Digital down converter 70 frequency shifts, filters and decimates the signal to produce lower sample rate inphase and quadrature signals on lines 72 and 74. A digital signal processor based demodulator 76 then provides additional signal processing to produce an output signal on line 78 for output device 80. --.

Column 4,
Lines 62, "FM in the preferred embodiment)…." should read -- FIG. 4 is a functional block diagram of the relevant portion of an FM Hybrid DAB receiver. An AM Hybrid DAB receiver would include nearly identical functionality. To facilitate the description of the invention in FIG. 4, program signal paths are shown as solid lines, while control signal paths are shown in broken lines. The signal input to the blend function on line 100 is the complex baseband modem signal (samples at 744,187.5 kHz for FM in the preferred embodiment)…. --.

Column 7,
Line 8, "e" should read -- the --.

UNITED STATES PATENT AND TRADEMARK OFFICE
CERTIFICATE OF CORRECTION

PATENT NO. : 6,590,944 B1
APPLICATION NO. : 09/261468
DATED : July 8, 2003
INVENTOR(S) : Brian William Kroeger It is certified that error appears in the above-identified patent and that said Letters Patent is hereby corrected as shown below:

Column 8,
Line 58, "claimed" should read -- claim --.

This certificate supersedes all previously issued Certificate of Corrections.

Signed and Sealed this

Twenty-seventh Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 6,590,944 B1
APPLICATION NO. : 09/261468
DATED : July 8, 2003
INVENTOR(S) : Brian William Kroeger It is certified that error appears in the above-identified patent and that said Letters Patent is hereby corrected as shown below:

Title page
Item (56) References Cited, other Publications, insert -- Hartup, D.C., Alley, D.M., Goldston, D.R., "AM Hybrid IBOC DAB System", Sept. 1997 --.

Column 3,
Line 52, "($f_c$+$f_{lo}$) and" should read -- ($f_c$+$f_{lo}$) and difference ($f_c$-$f_{lo}$) signals on line 62. Intermediate frequency filter 64 passes the intermediate frequency signal $f_{if}$ and attenuates frequencies outside of the bandwidth of the modulated signal of interest. An analog-to-digital converter 66 operates using a clock signal $f_s$ to produce digital samples on line 68 at a rate of $f_s$. Digital down converter 70 frequency shifts, filters and decimates the signal to produce lower sample rate inphase and quadrature signals on lines 72 and 74. A digital signal processor based demodulator 76 then provides additional signal processing to produce an output signal on line 78 for output device 80. --.

Column 4,
Lines 62, "FM in the preferred embodiment)…." should read -- FIG. 4 is a functional block diagram of the relevant portion of an FM Hybrid DAB receiver. An AM Hybrid DAB receiver would include nearly identical functionality. To facilitate the description of the invention in FIG. 4, program signal paths are shown as solid lines, while control signal paths are shown in broken lines. The signal input to the blend function on line 100 is the complex baseband modem signal (samples at 744,187.5 kHz for FM in the preferred embodiment)…. --.

Column 7,
Line 8, "e" should read -- the --.

UNITED STATES PATENT AND TRADEMARK OFFICE

CERTIFICATE OF CORRECTION

PATENT NO. : 6,590,944 B1 
APPLICATION NO. : 09/261468
DATED : July 8, 2003
INVENTOR(S) : Brian William Kroeger It is certified that error appears in the above-identified patent and that said Letters Patent is hereby corrected as shown below:

Column 8,
Line 58, "claimed" should read -- claim --.

This certificate supersedes all previously issued Certificate of Corrections.

Signed and Sealed this

First Day of May, 2007

JON W. DUDAS
*Director of the United States Patent and Trademark Office*